United States Patent

Wolters et al.

[11] Patent Number: 5,858,183
[45] Date of Patent: Jan. 12, 1999

[54] METHOD OF MANUFACTURING SEMICONDUCTOR DEVICES EACH INCLUDING A SEMICONDUCTOR BODY WITH A SURFACE PROVIDED WITH A METALLIZATION HAVING A TI LAYER AND A TIN LAYER

[75] Inventors: Robertus A. M. Wolters; Edwin T. Swart, both of Eindhoven, Netherlands

[73] Assignee: U.S. Philips Corporation, New York, N.Y.

[21] Appl. No.: 422,687

[22] Filed: Apr. 14, 1995

Related U.S. Application Data

[63] Continuation of Ser. No. 136,422, Oct. 13, 1993.

[30] Foreign Application Priority Data

Oct. 15, 1992 [EP] European Pat. Off. .............. 92203156

[51] Int. Cl.[6] .................................................. C23C 14/34
[52] U.S. Cl. ................................ 204/192.17; 204/192.13; 204/192.25; 437/192
[58] Field of Search ..................... 204/192.12, 192.13, 204/192.15, 192.16, 192.17, 192.21, 192.22, 192.25, 298.03; 437/192

[56] References Cited

U.S. PATENT DOCUMENTS

| | | | |
|---|---|---|---|
| 4,842,703 | 6/1989 | Class et al. | 204/192.12 |
| 5,108,569 | 4/1992 | Gilboa et al. | 204/192.13 |
| 5,240,880 | 8/1993 | Hindman et al. | 204/192.17 |
| 5,427,666 | 6/1995 | Mueller | 204/192.17 |

*Primary Examiner*—Robert Kunemund
*Assistant Examiner*—Rodney G. McDonald
*Attorney, Agent, or Firm*—Steven R. Biren

[57] ABSTRACT

A method of manufacturing semiconductor devices whereby first a Ti layer (8) and then a TiN layer (9) are deposited on slices of semiconductor material (20). The slices are placed on a support (30) one after the other in a deposition chamber (22), the support being positioned opposite a target of Ti (32) surrounded by an annular anode (31). Material is then sputtered off the target by means of a plasma (35) generated near the target. The plasma is generated in Ar during deposition of the Ti layer and in a gas mixture of Ar and $N_2$ during deposition of the TiN layer. After the deposition of the TiN layer, before a next slice is placed in the chamber each time, the target is cleaned during an additional process step in that material is sputtered off the target by means of a plasma generated in Ar. The additional process step is ended the moment the target has regained a clean Ti surface again. It is achieved by this that an extra Ti layer comprising nitrogen is indeed deposited on the TiN layer during this additional process step, but that this is as thin as possible and accordingly contains as little free Ti as possible. Undesirable chemical reactions between free Ti and the conductive layers deposited on the layer comprising nitrogen are suppressed as much as possible thereby.

6 Claims, 4 Drawing Sheets

METHOD OF MANUFACTURING SEMICONDUCTOR DEVICES EACH INCLUDING A SEMICONDUCTOR BODY WITH A SURFACE PROVIDED WITH A METALLIZATION HAVING A TI LAYER AND A TIN LAYER

This is a continuation of application Ser. No. 08/136,422, filed Oct. 13, 1993.

BACKGROUND OF THE INVENTION

1. Field of the Invention

The invention relates to a method of manufacturing semiconductor devices whereby first a Ti layer and then a TiN layer is deposited on slices of semiconductor material by placing the slices on a support one after the other in a deposition chamber, which support is arranged opposite a target of Ti surrounded by an annular anode, material is then sputtered off the target by means of a plasma which is generated near the target in Ar during the deposition of the Ti layer, and in a gas mixture of Ar and $N_2$ during the deposition of the TiN layer. The target is cleaned in an additional process step by sputtering off material therefrom by means of a plasma generated in Ar each time before a next slice is placed in the chamber.

2. Description of the Related Art

In modern IC technology, a metallization comprising a Ti layer, a TiN layer and a further conductive layer is often provided on a surface of a semiconductor body. The Ti layer serves to obtain a good adhesion and a low contact resistance between the metallization and the semiconductor body. When a layer of Al or of Al alloyed with a few percent of Si or Cu is used as the conductive top layer, the TiN layer serves as a barrier to prevent chemical reactions of the Al with the Ti and the semiconductor material situated underneath the barrier layer. When W is used as a conductive top layer, deposited by means of a usual CVD process (chemical deposition process) for which $WF_6$ is used, the TiN serves as a barrier to prevent chemical reactions between Ti and F which is formed during such a CVD process.

The depositions are carried out in practice on slices of semiconductor material which are broken or sawn into a large number of separate semiconductor chips at a later stage. A slice is passed through an input station into a first deposition chamber of a sputter deposition device, where the Ti and TiN layers are deposited by the method described above, after which the slice is transported to a second deposition chamber in which, for example, an Al or W layer is deposited, and finally the slice is taken from the device through an output station. When a slice leaves a deposition chamber, a new slice is immediately introduced into the chamber in practice.

During the deposition of the TiN layer, a plasma is generated in a gas mixture comprising Ar and $N_2$ near the Ti target. A top layer comprising nitrogen is created thereby on the target during this deposition step. Material is sputtered off this target during the extra process step, which material is then deposited on the slice. Thus a Ti layer comprising nitrogen is deposited on the slice, which layer initially consists of TiN and in which the nitrogen occurs in a decreasing concentration seen in the thickness direction of the layer. The layer accordingly merges well with the underlying TiN layer. If such a layer were instead deposited on the next succeeding slice instead of the Ti layer as a first layer of a metallization, then this metallization thereon would on the contrary exhibit a bad adhesion and a high contact resistance.

"Eclipse Newsletter", 10, Jun./Jul. 1992, discloses a method of the kind mentioned in the opening paragraph whereby the additional process step is continued for some time after cleaning of the target, so that another layer of pure Ti is deposited on the slice in addition to the Ti layer comprising nitrogen. This pure Ti layer serves to obtain a good adhesion with a further Al layer to be provided.

It is achieved by the known method that the layer deposited as a first layer on a slice has a good adhesion thereto and a low contact resistance because this layer consists of pure Ti owing to cleaning of the target. The known method has the disadvantage, however, that a further layer comprising free Ti is deposited on top of the TiN layer. If a conductive top layer of Al or Al alloyed with a few percents of Si or Cu is provided thereon, the Al and Ti react with one another, forming compounds with a comparatively high electric resistance. A good adhesion is then indeed obtained, but the conductive Al layer must then be provided to a comparatively great thickness in order to ensure that conductor tracks having a comparatively low resistance can be formed in the layer structure thus created. If a W layer is deposited on the said layer comprising free Ti by means of a usual CVD process (chemical deposition process) in which $WF_6$ is used, then the free Ti reacts with F formed during such a CVD process. This leads to the formation of $TiF_3$, to which W has a bad adhesion.

SUMMARY OF THE INVENTION

The invention has for its object inter alia to provide a method of metallization in which the said disadvantages are counteracted as much as possible.

According to the invention, the method mentioned in the opening paragraph is for this purpose characterized in that the additional process step of target cleaning is ended as soon as the target exhibits a clean Ti surface again. It is thus achieved that the Ti layer deposited as a first layer on the next succeeding slice consists of pure Ti and accordingly has a good adhesion to this slice and a low contact resistance. The said necessary additional process step takes as little time as possible in that cleaning of the target is ended as soon as it has a clean Ti surface. An additional layer of Ti comprising nitrogen is indeed deposited on the TiN layer of the present slice during this additional process step, but this additional layer is as thin as possible and accordingly comprises as little free Ti as possible. The said disadvantages are thus counteracted as much as possible.

Preferably, a constant electric power is supplied to the plasma during the additional process step, whereby a changing voltage arises between target and anode, which voltage reaches an end value which does not change any more during the additional process step, which end value is used for ending the additional process step.

The voltage arising between target and anode during the additional process step may be simply measured with a voltmeter. This voltage changes as long as the target still exhibits a surface of Ti comprising nitrogen, but reaches an end value as soon as the target exhibits a clean Ti surface again. After it has been determined how the additional process step will carried out, i.e. what power will be supplied to the plasma and at what pressure Ar will be led into the deposition chamber, this end value may be readily ascertained in that the sputtering-off of the target is continued once for a period longer than necessary. It can then be ascertained in a simple manner through measurement of the voltage between target and anode when the target has been cleaned.

When the additional process step is now stopped each time after the period thus ascertained has elapsed, the target will always exhibit the desired clean Ti surface after this process step. However, this method is not very practical. Preferably, therefore, according to the invention, the voltage between the target and the anode is measured during the additional process step and this process step is ended as soon as this voltage has reached the said end value.

To render it possible to deposit the TiN layer in a practical period of, for example, less than one minute, a comparatively large electric power must be supplied to the plasma in practice during the deposition of the TiN layer, for example, more than 6 kW. Preferably, according to the invention, a constant electric power is supplied to the plasma during the additional process step of cleaning the target which is smaller than the power supplied to the plasma during deposition of the TiN layer. The voltage between target and anode then reaches the said end value in a period which is so much longer than if the electric power were not reduced as a result, simpler means can suffice for ascertaining when the additional process step should be ended. Without this measure the cleaning step would have to be ended in practice, for example, after approximately 1 second, whereas with said measure, it is ended for example, after approximately 10 seconds.

To obtain a TiN layer with a substantially stoichiometric composition, comparatively small flows of Ar and $N_2$ are led into the deposition chamber during the deposition of this layer. Preferably, according to the invention, a flow of Ar is led into the deposition chamber during the additional process step which is greater than that which is led into the deposition chamber as part of the gas mixture of Ar and $N_2$ during the deposition of the TiN layer. As a result, the voltage between target and anode will reach a lower end value, while in addition the change of this voltage during the additional process step is greater. Thus it can be determined more accurately when the additional process step is to be ended.

BRIEF DESCRIPTION OF THE DRAWINGS

The invention will now be explained in more detail below by way of example with reference to the drawings preferred and embodiments. In the drawings.

DESCRIPTION OF THE PREFERRED EMBODIMENTS

Figure 1:
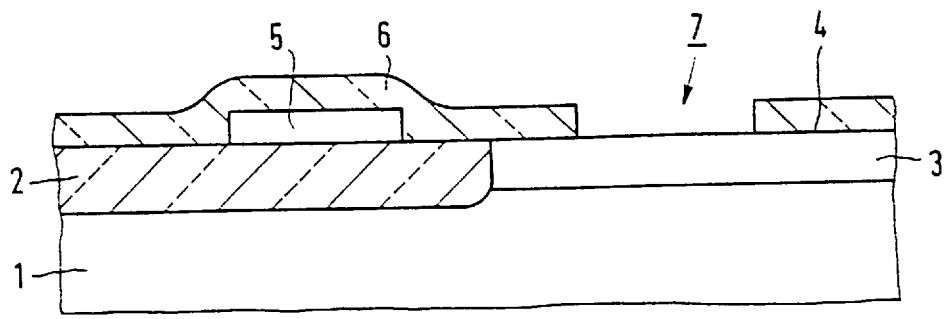
FIGS. 1 to 3 diagrammatically and in cross-section show a few stages of manufacture of a semiconductor device manufactured by the method according to the invention, FIG. 4 diagrammatically shows a sputter deposition device for carrying out the method according to the invention, FIG. 5 diagrammatically shows one of the deposition chambers in the device according to FIG. 4.
Figure 2:
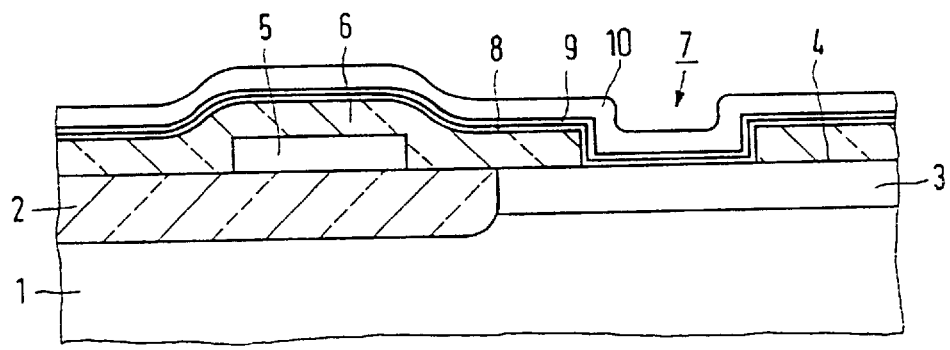
Figure 3:
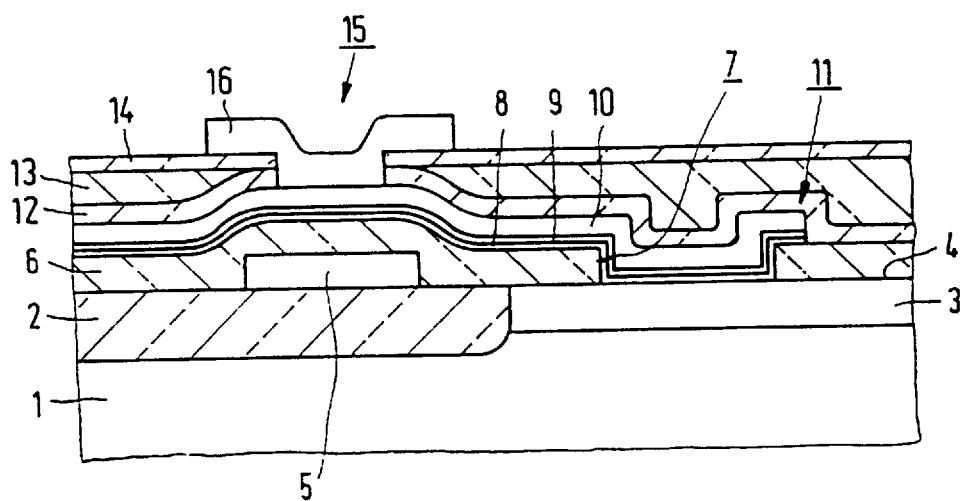

FIGS. 1 to 3 diagrammatically and in cross-section show a few stages of manufacture of a semiconductor device with a semiconductor body 1 of, for example, n-type doped monocrystalline Si in which field oxide regions 2 and p-type doped semiconductor zones 3 adjoining the surface 4 are provided in usual manner. Conductor tracks 5 of polycrystalline Si are provided on the surface 4. Then the surface 4 is provided with an insulating layer 6 of, for example, silicon oxide, silicon nitride, or silicon oxynitride. Windows 7 are provided in the insulating layer 6 for contacting silicon regions situated below the insulating layer 6. These silicon regions may be regions of monocrystalline silicon which may or may not be provided with a top layer of a metal silicide.

Then a package of layers 8, 9, 10 is provided on the insulating layer 6 and in the contact window 7, comprising a Ti layer 8, a TiN layer 9, and a further conductive top layer 10. The Ti layer 8 then serves to obtain a good adhesion between the layer package 8, 9, 10 and the semiconductor zone 3 plus the insulating layer 6, and to obtain a low contact resistance between the layer package 8, 9, 10 and the semiconductor zone 3. When a layer of Al or of an alloy of Al with a few percents of Si or Cu is used as the conductive top layer 10, the TiN layer 9 serves as a barrier to prevent chemical reactions of the Al with the Ti and the semiconductor material situated below the barrier layer. When a W layer is used as the conductive top layer 10, deposited by means of a usual CVD process (chemical deposition process) in which $WF_6$ is used, the TiN layer serves as a barrier to prevent chemical reactions between Ti and F which is formed during such a CVD process.

After a pattern of conductors 11 has been etched into the layer package 8, 9, 10 in usual manner, which conductors are connected to the semiconductor zones 3 through the contact windows 7, a package of insulating layers 12, 13, 14 is provided in that order. A layer of silicon oxide 12 is deposited in a plasma deposition process (PECVD), a layer of spin-on glass (SOG) 13 is deposited by a spin-on method, and then a layer of silicon oxide 14 is provided in a plasma deposition process (PECVD) again. Contact windows 15 are provided in the layer package 12, 13, 14 so that a conductor pattern 16 provided on the package makes contact with the Al top layer 10. Since the use of the layer of spin-on glass 13 in the layer package 12, 13, 14 has a smoothing effect, the upper silicon oxide layer 14 is comparatively plane.

Figure 4:
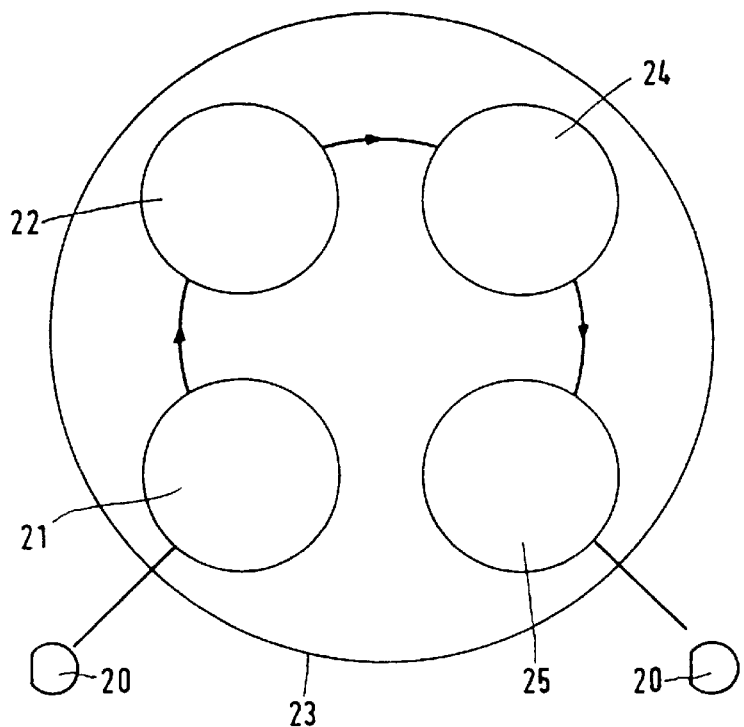

During the manufacture of the semiconductor devices, the field oxide regions 2 and the semiconductor zones 3 are provided in slices of semiconductor material, which will be broken or sawn into a large number of separate semiconductor chips 1 in a later stage, and provided with the insulating layer 6 with contact windows 7. Then first a Ti layer and subsequently a TiN layer are deposited on these slices. As is diagrammatically shown in FIG. 4, a slice 20 is introduced into a first deposition chamber 22 of a sputter deposition device 23 through an input station 21 in this case, the Ti and TiN layers being deposited in this chamber, after which the slice is transported to a second deposition chamber 24 in which, for example, a layer of Al or W is deposited, and finally the slice is taken from the device again through an output station 25. When a slice leaves a deposition chamber, in practice a new slice is immediately introduced into the chamber.

Figure 5:
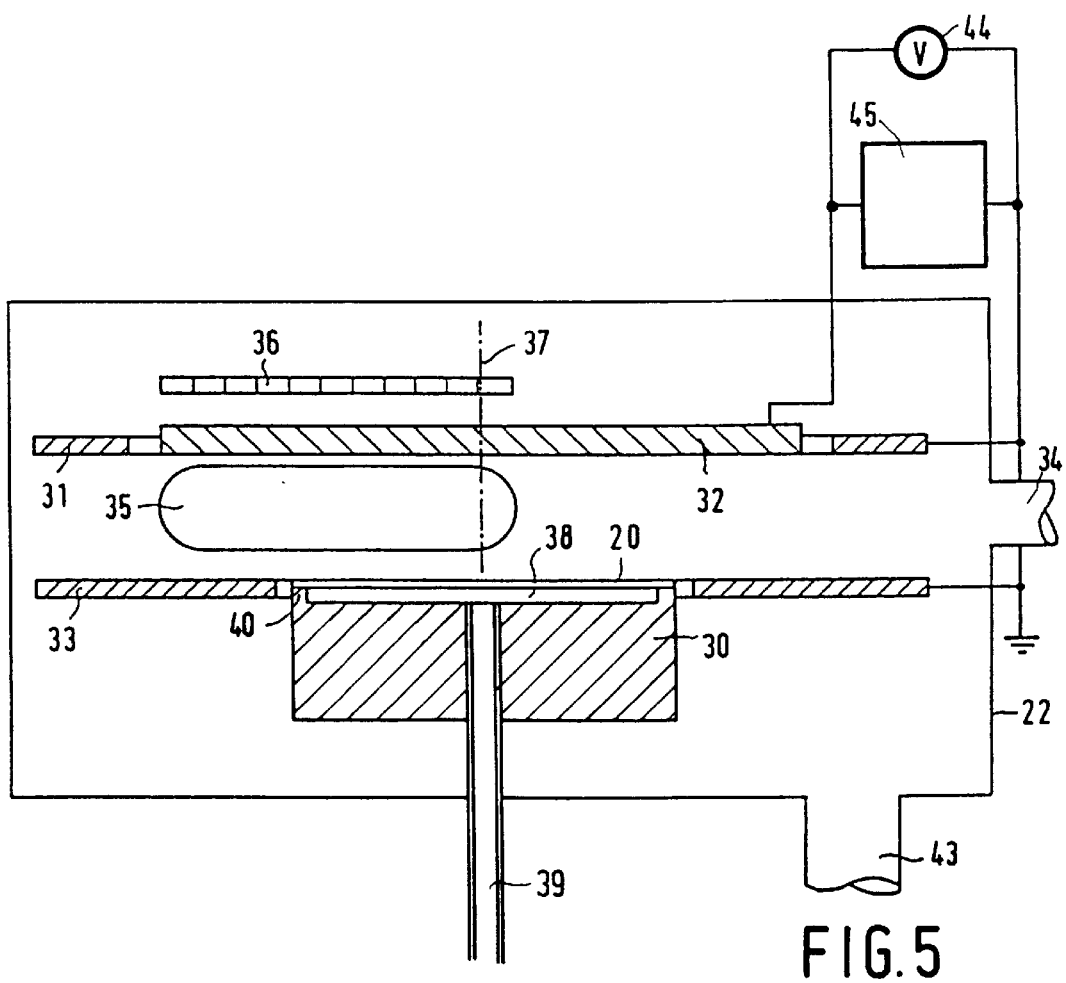

FIG. 5 diagrammatically shows a cross-section through the deposition chamber 22 in which the Ti and TiN layers are deposited on the slices 20. A slice 20 with a diameter of approximately 15 cm is this purpose placed in the deposition chamber 22 on a support 30 which is arranged at a distance of approximately 5 cm opposite a Ti target 32 of approximately 26 cm diameter surrounded by an annular anode 31.

An earthed screen 33 is provided around the support. Then a gas or gas mixture is led into the deposition chamber 22 through a feed line 34. An electric supply source 45 is connected between the target 32 and the annular anode 31 whereby a plasma 35 is generated in the gas or gas mixture, which plasma is enclosed between the target 32 and the slice 20 and in the vicinity of the target 32 by means of magnets 36 arranged behind the target 32.

The magnets 36 are jointly rotatable about an axis 37. In practice, they rotate about the axis 37 a few times each second during the deposition process, so that the plasma 35 is rotated about the same axis 37. It is achieved thereby that atoms are homogeneously sputtered off the entire surface of the target 32, so that also a homogeneous deposition all over the slice 20 is obtained.

The slice 20 is cooled during deposition in that a gas cushion 38 with a pressure of 100 to 2000 Pa is maintained between the support 30 and the semiconductor slice 20. Ar is conducted to between the support 30 and the slice 20 through a gas line 39. The support 30 is provided with a rim 40 against which the slice 20 is pressed by clamps (not shown). Leakage of Ar from the gas cushion 38 into the deposition chamber 22 is limited by this. The support 30 is kept at a temperature of 200° to 400° C. during the deposition of the Ti and TiN layers by usual means (not shown).

The chamber 22 is further provided with a gas outlet 43 which is connected to a pump (not shown) by which gases can be discharged and by which the reaction chamber 22 can be maintained at a desired pressure.

After a slice 20 has been placed on the support 30, material is sputtered off the target 32 by the plasma 35 which is generated near the target 32 in Ar during the deposition of the Ti layer and in a gas mixture of Ar and $N_2$ during the deposition of the TiN layer. After that, in an additional process step, the target 32 is cleaned each time before a next slice 20 is placed in the chamber 22 in that material is sputtered off the target 32 by means of a plasma generated in Ar.

A plasma 35 is generated near the target 32 in a gas mixture comprising Ar and $N_2$ during the deposition of the TiN layer 9. This results in a top layer comprising nitrogen (not shown) on the target 32 during this deposition step. During the additional process step of target cleaning, material from this target 32 is deposited on the slice 20. Thus a layer of Ti comprising nitrogen (not shown) is deposited on the slice, which layer initially consists of TiN and in which the nitrogen is present in a decreasing concentration seen in the thickness direction of the layer. The layer accordingly merges well with the already deposited TiN layer. If such a layer were to be deposited on the next succeeding slice as a first layer of metallization instead of the Ti layer, this metallization would exhibit a bad adhesion thereto and a high contact resistance.

According to the invention, the additional process step of target cleaning is ended the moment the target 32 shows a clean Ti surface again. It is achieved by this that the Ti layer 8 deposited as a next succeeding first layer on a slice 20 consists of pure Ti and accordingly has a good adhesion to this slice 20. This necessary additional process step is as short as possible owing to the fact that cleaning of the target 32 is ended the moment it shows a clean Ti surface. It is true that a layer of Ti comprising nitrogen is deposited on the TiN layer of the present slice during this additional process step, but this layer is as thin as possible and accordingly contains as little free Ti as possible. When a conductive top layer of Al or of an alloy of Al with a few percents of Si or Cu is provided on this layer, the Al and Ti react with one another, forming compounds which have a comparatively high electrical resistance. A good adhesion is then indeed obtained, but the conductive Al layer must then be provided to a comparatively great thickness in order to ensure that conductor tracks having a comparatively low resistance can be formed in the layer package thus formed. When a layer of W is subsequently deposited on the said layer comprising free Ti by means of a usual CVD process (chemical deposition process) in which $WF_6$ is used, then the free Ti will react with F which is formed during such a CVD process. $TiF_3$ is formed thereby, to which W has a bad adhesion. These drawbacks are counteracted as much as possible in that now the quantity of free Ti in the nitrogen-containing layer deposited on the TiN layer is limited as much as possible.

Figure 6:
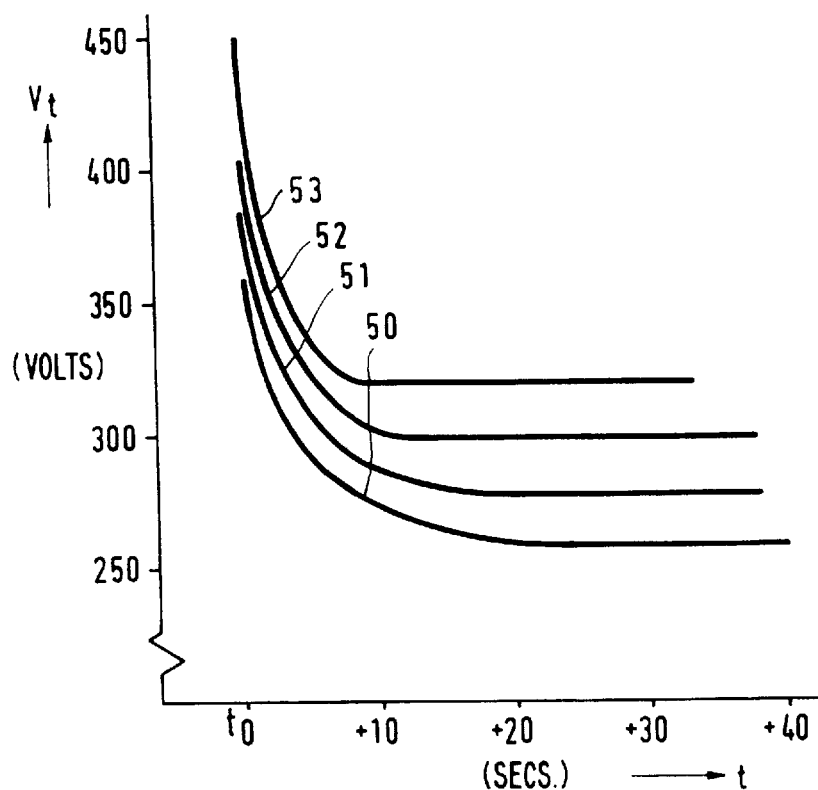
FIG. 6 shows the gradient of the voltage $V_t$ between the target and the anode from the moment $t_0$ at which the deposition of the TiN layer was ended, an electric power of 0.3 kW, 0.5 kW, 1 kW and 2 kW being supplied to the plasma.
Figure 7:
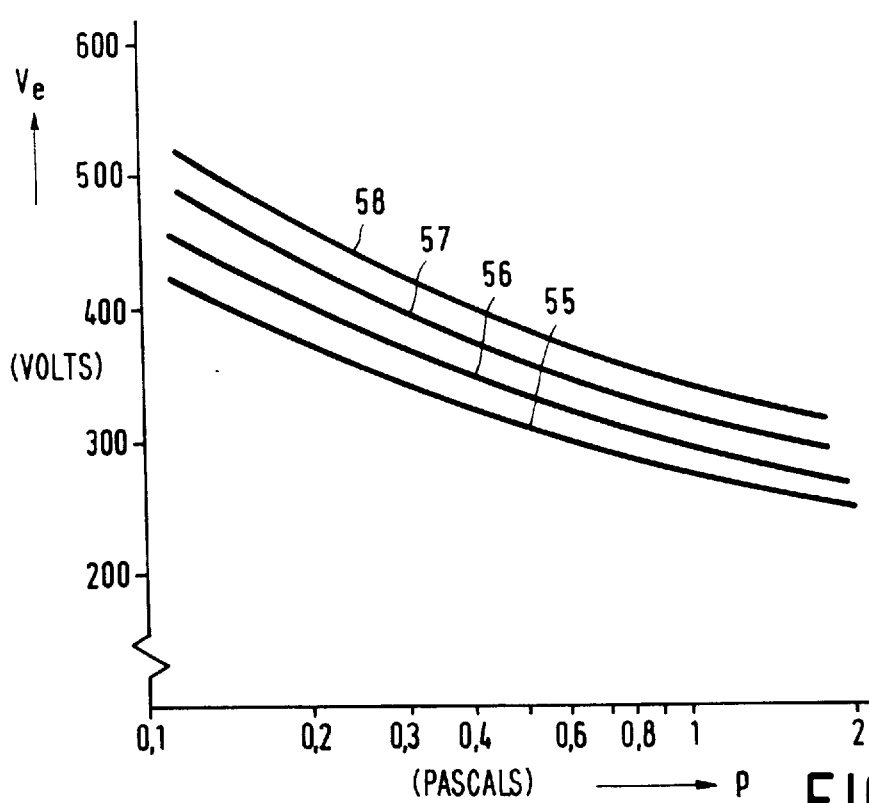
FIG. 7 shows the gradient of the end values $V_e$ as a function of the pressure p with which Ar was led into the deposition chamber, an electric power of 0.3 kW, 0.5 kW, 1 kW and 2 kW being supplied to the plasma.

A constant electric power is supplied to the plasma during the additional process step. This leads to a changing voltage V, between target and anode which reaches an end value $V_e$ which does not change any more. FIG. 6 shows the gradient of this voltage $V_t$ after the moment $t_0$ at which the deposition of the TiN layer was stopped. During the TiN deposition, a power of 6 kW was fed to the plasma, while a gas mixture of 5 sccm (standard cubic centimeters per minute) Ar and 15 sccm $N_2$ was led into the reaction chamber. The supply of $N_2$ was stopped and the supply of Ar was increased to 50 sccm at moment $t_0$, whereby a gas pressure of 1.60 Pa was generated in the reaction chamber. The power supplied to the reaction chamber was reduced to 0.3 kW, 0.5 kW, 1 kW or 2 kW. The curves 50, 51, 52 and 53 in FIG. 6 indicate for these cases how the voltage $V_t$ changes as a function of time. It is apparent that the end value $V_e$ was reached after 25, 18, 12 and 9 seconds, respectively, for these power supply values. The end value $V_e$ in these cases was 260 V, 280 V, 300 V and 320 V, respectively. Preferably, a constant electric power of 2 kW or less is supplied to the plasma during the additional process step. The end values $V_e$ will otherwise be reached in an unpracticably short time. FIG. 7 shows a graph of the end values $V_e$ as a function of the pressure p with which Ar was led into the deposition chamber, with electric powers of 0.3 kW, 0.5 kW, 1 kW and 2 kW being supplied to the plasma as indicated by the curves 55, 56, 57 and 58. It is found that the voltage $V_t$ reaches an end value $V_e$ which does not change any more except that it is dependent on the pressure p with which Ar is led into the reaction chamber and on the power supplied to the plasma. The end value $V_e$ is used for ending the additional process step. In the cases indicated above, a layer of Ti comprising nitrogen of a thickness of 8 to 10 nm is found to have been deposited during the additional process step each time.

The voltage $V_t$ may be simply measured with a voltmeter 44 in FIG. 5. This voltage changes as long as the target 32 still has a surface of Ti comprising nitrogen, but reaches an end value V: the moment the target 32 shows a clean Ti surface again. A selection is made as to what electric power will be supplied to the plasma and with what pressure Ar will be conducted into the deposition chamber in order to achieve that the additional process step can be carried out in a desired time. The end value $V_e$ may then be readily determined in that sputtering off of the target 32 is continued once for a longer period than necessary under these chosen process conditions. It can subsequently be ascertained in a simple manner through measurement of the voltage $V_t$ after what time the target had become clean.

When the additional process step is now stopped after the time thus ascertained has elapsed, the target will always have the desired clean Ti surface after this process step. However, this method is not very practical. Preferably, therefore, according to the invention, the electric voltage between the target and the anode is measured during the additional process step and this process step is ended the moment this voltage has reached the said end value.

A comparatively high electric power, for example more than 6 kW, is supplied to the plasma in practice during the deposition of the TiN layer in order to deposit the TiN layer in a practical time of, for example, less than 60 seconds. According to the invention, a constant electric power smaller than the power supplied to the plasma during the deposition of the TiN layer is supplied to the plasma during the additional process step. The voltage between target and anode then reaches the said end value in a so much longer time than if the electric power were not reduced that it can be ascertained by simple means when the additional process step is to be ended. Without the measure, the step would have to be ended in practice, for example, after approximately 0.5 second, and with the measure, for example, after the more practical times mentioned above.

Figure 8:
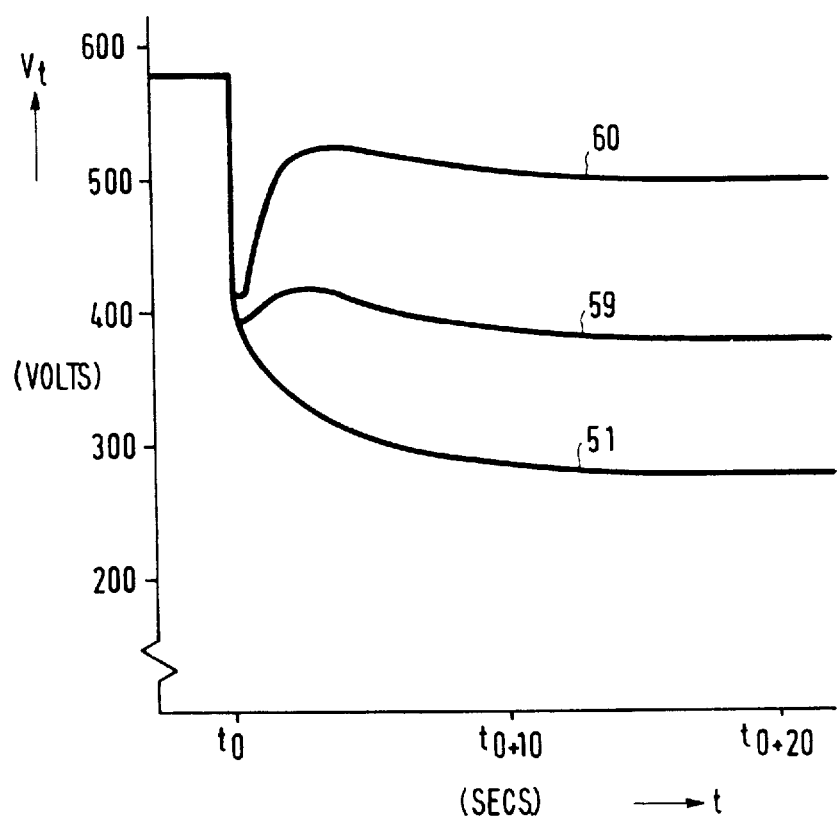
FIG. 8 shows the gradient of the voltage $V_t$ with a power of 0.5 kW being supplied to the plasma and Ar being led into the deposition chamber at pressures of 1.60 Pa, 0.25 Pa and 0.13 Pa.

Comparatively small flows of 5 sccm Ar and 15 sccm $N_2$ are led into the deposition chamber during the deposition of the TiN layer in order to obtain a TiN layer with a substantially stoichiometric composition. Preferably, according to the invention, a flow of Ar is led into the deposition chamber during the additional process step which is greater than the flow led into the deposition chamber during the deposition of the TiN layer as part of the gas mixture of Ar and $N_2$. FIG. 8, like FIG. 6, shows the gradient of the voltage $V_t$ for the case in which a power of 0.5 kW was supplied to the plasma during the additional process step. Curve 51 in FIG. 8 again indicates how $V_t$ changes when Ar is led into the deposition chamber at a pressure of 1.60 Pa. Curves 59 and 60 show the gradient when Ar is led into the deposition chamber at a pressure of 0.25 Pa and 0.13 Pa, respectively. This latter pressure would be obtained when in the present example the Ar flow were left unchanged after the $N_2$ supply was closed off. It is found that the increase in the Ar flow achieves that the voltage $V_t$ between target 32 and anode 31 reaches a lower end value, while in addition the change in this voltage during the additional process step is greater. This means that it can be determined more accurately when the additional process step is to be ended.

Preferably, a flow of Ar is led into the deposition chamber during the additional process step by which a pressure of more than 1 Pa arises in the deposition chamber. It is achieved then that the voltage $V_t$ decreases only from the moment $t_0$ and does not show a gradient as for lower pressures, as shown in FIG. 8 by the curves 59 and 60. In these cases it is less easy to ascertain when the end value $V_e$ has been reached.

We claim:
1. A method of metallizing a series of semiconductor slices preparatory to their being formed into semiconductor devices, said method comprising the steps of:
    (a) passing a semiconductor slice into a deposition chamber wherein it is supported opposite a target of Ti surrounded by an annular anode, and supplying electric power between said target and said anode; then
    (b) passing Ar gas into the deposition chamber so as to generate a plasma in Ar near the Ti target which causes sputtering of material therefrom and deposition of a layer of Ti on the semiconductor slice; then
    (c) passing a gas mixture of Ar and nitrogen into the deposition chamber so as to generate a plasma in said gas mixture near said Ti target which causes sputtering of material therefrom, deposition of a layer of TiN on the Ti layer on said slice and formation of a layer comprising nitrogen on the surface of the target during the deposition of the layer of TiN on the Ti layer; and, then
    (d) forming a plasma in Ar near the Ti target to cause further sputtering of material therefrom which clears the surface of said target of the layer comprising nitrogen, and then terminating said further sputtering as soon as said surface has been cleared of the layer comprising nitrogen, the electric power supplied between said target and said anode being maintained constant during this step (d), thereby producing a changing voltage there-between which after a time reaches a constant end value, and said further sputtering being terminated when said voltage has reached said constant end value.

2. A method as claimed in claim 1, wherein during step (d) the voltage between said target and said anode is measured, and said further sputtering is terminated when said measured voltage has reached said constant end value.

3. A method as claimed in claim 1, wherein the constant electric power supplied during step (d) is smaller than that supplied during step (c).

4. A method as claimed in claim 3, wherein the constant electric power supplied during step (d) is 2 kW or less.

5. A method as claimed in claim 1, wherein the flow of Ar gas into the deposition chamber is greater during step (d) than during step (c) as part of a gas mixture of Ar and $N_2$ for depositing a TiN layer.

6. A method as claimed in claim 5, wherein the flow of Ar gas into the deposition chamber during step (d) is such as to produce a pressure of more than 1 pa therein.

* * * * *